United States Patent [19]
Milton

[11] 3,754,240
[45] Aug. 21, 1973

[54] GAIN DECISION LOGIC FOR INTEGRATING ANALOG-TO-DIGITAL CONVERTERS

[75] Inventor: James E. Milton, Boca Raton, Fla.

[73] Assignee: International Business Machines Corporation, Armonk, N.Y.

[22] Filed: Oct. 19, 1971

[21] Appl. No.: 190,501

[52] U.S. Cl. .......... 340/347 NT
[51] Int. Cl. .......... H03k 13/10
[58] Field of Search .......... 340/347 NT, 347 AD, 340/347 CC; 324/99 D

[56] References Cited

UNITED STATES PATENTS

| | | | |
|---|---|---|---|
| 3,582,777 | 6/1971 | Wunderman | 340/347 NT |
| 3,299,421 | 1/1967 | Neitzel | 340/347 CC |

*Primary Examiner*—Maynard R. Wilbur
*Assistant Examiner*—Joseph M. Thesz, Jr.
*Attorney*—Earl C. Hancock et al.

[57] ABSTRACT

Unknown analog signals are coupled through a selectable gain amplifier to an integrating analog-to-digital converter. A first analog-to-digital conversion cycle is performed which sequentially increments counters associated with the converter circuit while the amplifier gain is held at a preselected level. Logic circuitry responds to certain counts in those counters to select an optimum amplifier gain setting to be used during a second conversion cycle. The cycle amplifier gain setting and conversion result are accurately correlated to the amplitude of the unknown analog input. Identity between the gain decision and the first conversion cycle gain setting can be detected to bypass the second conversion cycle.

6 Claims, 3 Drawing Figures

INVENTOR
JAMES E. MILTON

BY Earl C. Hancock

ATTORNEY

GAIN DECISION LOGIC FOR INTEGRATING ANALOG-TO-DIGITAL CONVERTERS

CROSS REFERENCE TO RELATED APPLICATION

Application, Ser. No. 131,748 entitled, "Improved Analog-to-Digital Converter Circuits," filed Apr. 6, 1971 by George A. Hellwarth and James E. Milton and assigned to the same assignee as this Application is concerned with certain improvements in the circuits used for multi-ramp integrating analog-to-digital converter systems.

BACKGROUND OF THE INVENTION

1. Field of the Invention

This invention relates to circuits for handling unknown analog signals and for converting those signals to digital equivalents. More particularly, the present invention relates to subsystems for handling unknown analog signals of a relatively wide variety of magnitudes in such a manner that the signal is automatically converted to its equivalent digital representation with an optimum signal level to the conversion circuit. The invention is particularly useful in systems for sampling any of a large number of unknown analog input signals such as through a multiplexer and for converting those signals to digital equivalents which can then be utilized by data processing equipment of various kinds.

2. Description of the Prior Art

Various arrangements have been devised to handle analog signals and convert them to their digital equivalents in order to provide digital input signals that can be handled by data processing apparatus such as computers and the like. Basically these analog-to-digital converter or ADC circuits have used techniques involving the comparison of the unknown analog voltage to known reference voltages to perform this function. A relatively reliable but economic approach to this ADC operation involves the use of integrating circuits which sample the unknown analog for a certain period of time and thereafter integrate in an opposite direction against known reference levels to produce the digital equivalent of the analog input by counting the number of pulses occurring during the time required to integrate the reference voltages. Such an integrating ADC for a dual ramp operation which is useful in an environment requiring periodic conversion cycles wherein circuit settling through continuous operation cannot be tolerated is shown in the Jan. 1963 IBM Technical Disclosure Bulletin (Vol. 5, No. 8) at pages 51–52 in the article entitled, "Analog to Digital Converter," by C. H. Propster, Jr. Subsequently the speed of operation for such systems was improved without accuracy degradation by the multi-ramp integrating circuit shown in U.S. Pat. No. 3,577,140 by Aasnaes which issued on May 4, 1971 from application Ser. No. 649,161 filed June 26, 1967. Still further improvements in both the speed and accuracy of these circuits are shown in the cross-referenced copending Application, Ser. No. 131,748 by Hellwarth et al.

These various integrating ADC subsystems generally utilize a common amplifier which coupled the analog signal sampled by the multiplexer circuits to the ADC. When a large variety of different potential magnitudes of unknown analog signals must be sampled, a problem is encountered in designing the ADC so that it will always be operating at the magnitude of analog input signal which produces the result of optimum accuracy. That is, if the analog input signal is of an extremely low magnitude so that only an insignificant number of bits can be counted during the reference level integration or if the analog input is so large that the counters overflow, the digital conversion results are of little value. Thus, there have been various attempts to control the level of the unknown analog input to the ADC prior to its actual conversion.

It is well known that the gain of an amplifier can be controlled by switching a resistance network in the feedback of that amplifier. That is, a digital register can be loaded with a byte of data to select particular switch points in the resistive feedback of the amplifier so that the amplifier gain will be a function of the bits contained in the byte loaded into the register. Whenever the unknown analog signal to be sampled will be of a predictable range, the controlling system or computer can set this gain selecting register at the appropriate level and the digital conversion results can be expected to be within a usable range. Unfortunately, many analog inputs being sampled by multiplexer type systems vary over a relatively large range and, therefore, the presumed gain setting may still result in an unreliable result. Further, predicting the expected signal range places a considerable burden on the controlling system particularly when a large number of multiplexer points are to be sampled. Various other approaches including attenuator networks in each of the analog input lines suffer from the same deficiency and require acceptance of further disadvantages such as degraded reliability, noise sensitivity and the like. One approach for handling the variety of unknown analog input signals by controlling the sampling period thereof are shown in U.S. Pat. No. 3,582,947, "Integrating Ramp Analog-to-Digital Converter," by T. J. Harrison which issued June 1, 1971. In the approach suggested by FIG. 7 of the Harrison patent, a threshold circuit selects an equivalent integrator gain as a function of the magnitude of the unknown analog input signal as represented by the slope of the integrator output during the sampling period.

Efforts to automatically control the gain of the common amplifier which provides the input to the ADC circuit have taken several approaches. For instance, it has been suggested that the output of the amplifier can be sensed by a threshold type circuit so that the gain control register will be incremented or decremented until the amplifier level has dropped below an acceptable value. Such an approach requires acceptance of the reliability of that threshold circuit and cannot be operated with assurance that the ADC will in fact be operating in its range of optimum accuracy. Further, the operation to raise the amplifier gain so as to bring the amplifier level up from below a minimum acceptable value requires an addition of yet another threshold circuit.

Yet another approach has suggested that an unknown analog signal be converted through an ADC to a digital equivalent and the presence of an overflow as a result of that conversion be used to decrement the gain control register by one after which another conversion cycle is performed. For an unknown analog signal of a large magnitude, such an arrangement would require many complete conversion cycles before the optimum gain has been reached. None of the various prior art techniques have proven to provide acceptable accuracy, reliability and operating speed performance for use with multi-ramp integrating analog digital converter circuits.

SUMMARY OF THE INVENTION

This invention permits the application of multi-ramp integrating analog-to-digital converters to systems which require the sampling of a wide variety of unknown analog input signal magnitudes. The invention employs an amplifier which has a digitally selectable gain control. The sampled analog input is passed through that amplifier with a preselected initial gain and a conversion of the amplifier output to a digital representation through the multi-ramp integrating circuit is performed. Logic circuitry inspects the counters associated with the multi-ramp integrating converter result of this first pass or cycle to logically decide upon the gain setting which would provide an optimum result. That optimum gain setting is then transferred to the selectable gain amplifier and used to provide the optimum analog input level to the integrating ADC. The result of the second cycle as contained in the multi-ramp integrating converter counters along with a representation of the gain setting used for the second cycle are transferred to the controlling data processing equipment since the composite of those signals represents the digital equivalent of the unknown input. Thus the present invention relieves the controlling system of the need to predict amplifier gain levels by automatically selecting the gain which produces a conversion result with optimum ADC resolution.

The invention can be further improved by including circuitry for inspecting the gain selection decided upon at the end of the first conversion cycle and the gain used for that first conversion cycle to decide whether or not to transfer the data directly to the processor without resort to a second cycle. This event would occur when the gain decision and the preselected initial gain were identical which would indicate that a second conversion cycle would be redundant.

Thus the present invention permits the ADC subsystem to autonomously and automatically select the optimum gain for a conversion operation. Further, the controlling data processing equipment can be used to select the amplifier gain directly if the optimum gain is known in advance and thus operate with a single conversion cycle, if desired, or to select the automatic mode, if that should be desired. By selecting the initial cycle gain for the automatic subsystem of this invention so that it correlates with the expected optimum gain for the greatest number of analog signals to be sampled and by further including the aforementioned gain comparison feature, it is possible to realize both the advantage of higher speed operation and the advantage of relieving the control system of predicting optimum gain levels.

An object of this invention is to permit automatic gain selection decisions in association with a multi-ramp integrating analog-to-digital converter subsystem.

Another object is to provide an ADC subsystem that can automatically and autonomously select an input amplifier gain corresponding to optimum ADC accuracy independent of the controlling system.

A further object is to provide an analog-to-digital converter subsystem which can be selected for either automatic gain decision or which can be directly controlled by the controlling data processing equipment.

Yet another object of the present invention is to provide logic circuitry for inspecting the counters associated with a multi-ramp integrating ADC subsystem to determine the optimum gain setting of a variable gain amplifier for accurate conversion operation.

A still further object of the present invention is to provide a logical subsystem associated with the counters of a multi-ramp integrating ADC for determining that a second cycle of conversion should be performed with a new input amplifier gain setting or that the conversion result can be used directly.

The foregoing and other objects, features and advantages of the present invention will be apparent from the following more particular description of the preferred embodiment of the invention as is illustrated in the accompanying drawings.

DESCRIPTION OF PREFERRED EMBODIMENT

Figure 1:
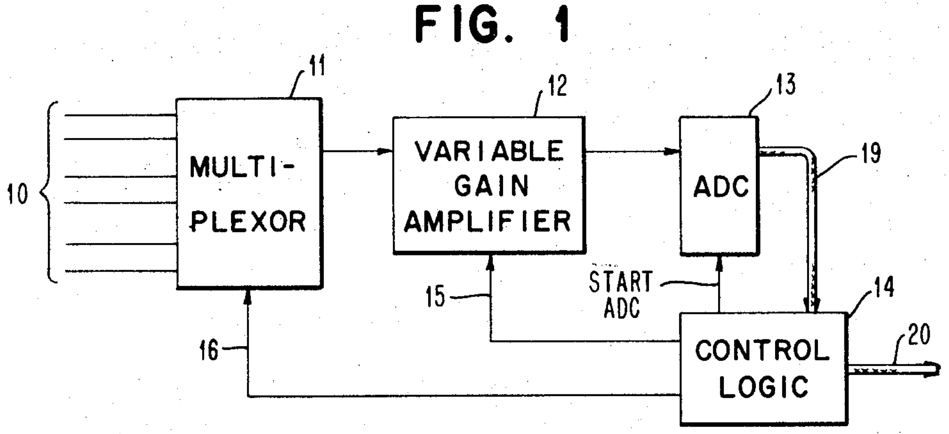
FIG. 1 shows an overall block diagram arrangement of an analog-to-digital converting subsystem which can incorporate the present invention.

The main components of a typical analog data acquisition subsystem for automated data collection are shown in a block diagram in FIG. 1. It consists of a multiplexer 11 to select one of several analog voltage sources 10 to be measured, a programmable gain amplifier 12 to amplify low level signals, an analog-to-digital converter (ADC) 13, and control logic 14 to initiate multiplexer selection, specify the amplifier gain, start the ADC, and transfer the conversion result over output 20 to the user such as a computer (not shown). The operation of such an ADC subsystem in conjunction with a computer is well known by those having normal skill in the art and will not generally be discussed further.

This ADC subsystem can include an automatic gain selection in accordance with this invention by adding control logic to cause two complete ADC conversion cycles for each multiplexer selection. The first ADC conversion cycle is done with the amplifier set on a known gain. The result of this first conversion is decoded by the logic to specify the optimum gain which is then used for the second ADC conversion cycle.

Figure 2:
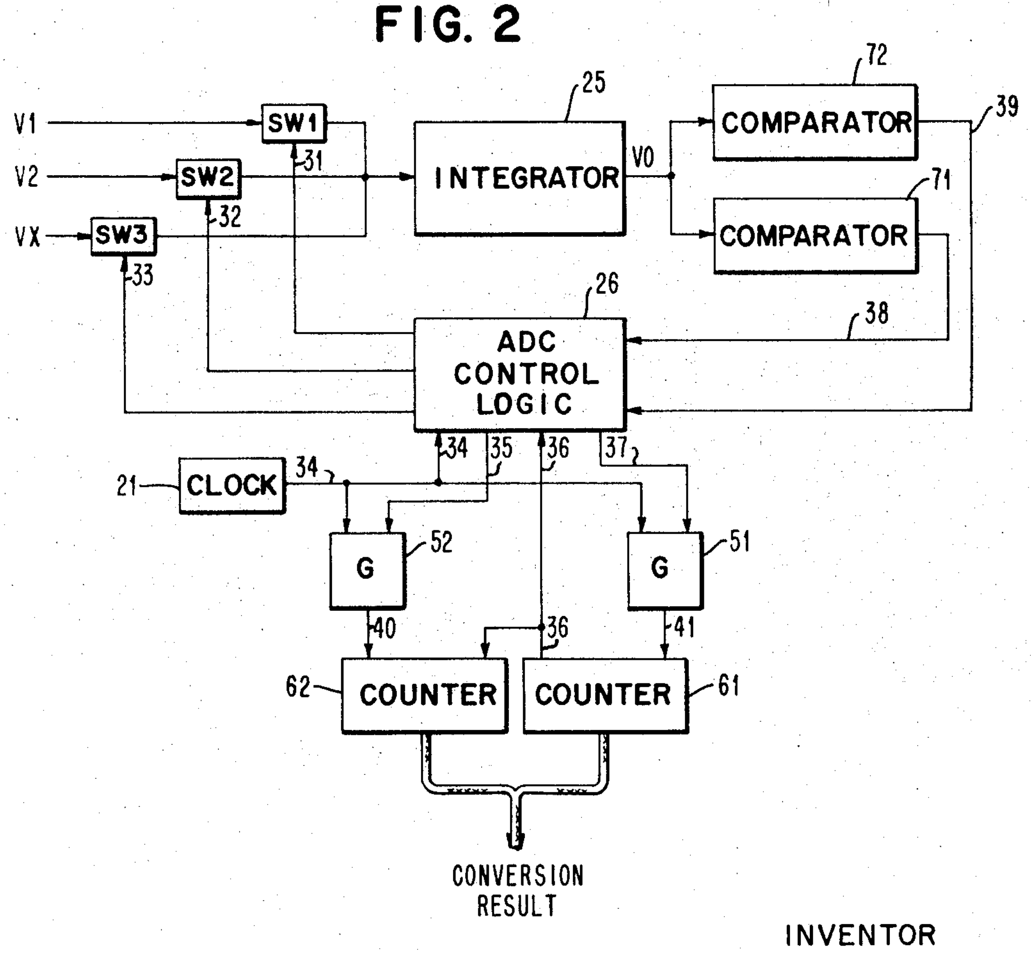
FIG. 2 shows the specific components associated with a multi-ramp integrating analog-to-digital converter subsystem including the control logic and its associated circuitry for triple-ramp conversion of sampled analog input signals.

For integrating-type ADC arrangements such as were cross-referenced hereinbefore, logic circuitry of this invention can be readily incorporated for automatic gain decision. An integrating-type ADC is shown in a block diagram in FIG. 2 and its operation will now be described.

After an appropriate initializing action, the integrator 25 output VO is at some initial voltage, VF. Switch SW3 is turned on by the control logic, 26, by means of 33 to connect the unknown voltage, VX, to the integrator input to start the sampling period. At the same time gate 51 is turned on by 37 so that the clock 21 increments counter 61. When counter 61 overflows (36), SW3 (33) and gate 51 (37) are turned off and SW2 (32) and gate 52 (35) are turned on.

Reference voltage V2 which is of opposite polarity to VX is then integrated until the integrator output VO reaches a threshold level, VT, indicated by the drop of comparator 72 at line 39. During the V2 integration period, counter 62 is incremented by the clock 21. When 72 drops, SW2 and gate 52 (35) are turned off and SW1 (31) and gate 51 (37) are turned on.

Reference voltage V1 which is much smaller in magnitude than V2 is then integrated until the integrator output VO reaches VF, indicated by the drop of line 38 from comparator 71. For the duration of this V1 integration time, counter 61 is incremented by the clock 21. Any overflow indicated on line 36 from 61 during this time causes 62 to be incremented by one count. When the comparator 71 output drops, SW1 (31) and gate 51 (37) are turned off.

The result of the conversion is then contained in the counters 61 and 62 when considered as one continuous counter wherein 61 contains the low order bits. This type of ADC is described in detail in the aforementioned U.S. Pat. No. 3,577,140 by Aasnaes as well as in the referenced copending application, Ser. No. 131,748 by G. A. Hellwarth and J. E. Milton.

Figure 3:
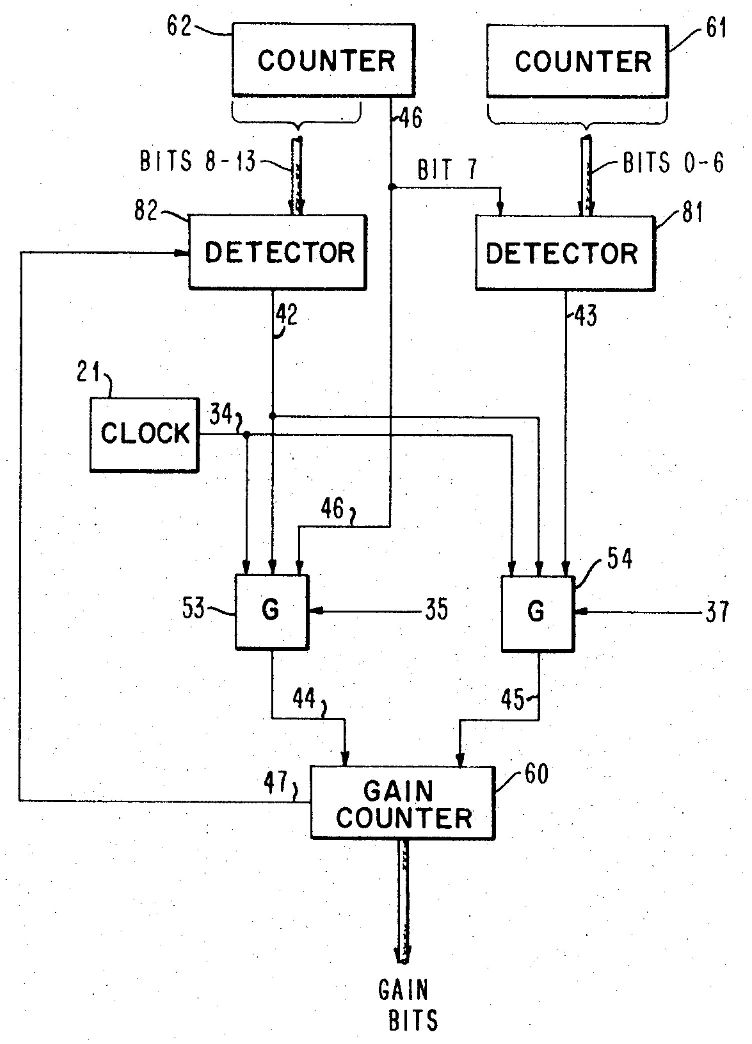
FIG. 3 illustrates logic circuitry associated with the FIG. 2 components for inspecting the counts of the multi-ramp integrating system and determining the optimum gain which should be used for a common selectable gain amplifier.

The invention consists of logic circuitry to monitor the ADC counter bits as they appear in counters 61 and 62 during the integration of reference voltages V2 and V1 and to detect certain combinations of bits or binary numbers which correspond to the input voltages at which the amplifier gain should be switched to maintain the optimum gain. This gain decode logic is shown in FIG. 3.

Specific assumed gain-switching input voltages and their corresponding equivalent binary numbers, which can be used in a typical implementation, are shown in Table 1 as an example, to simplify the explanation of this invention.

TABLE 1

Gain Switching Voltage Levels

| Gain Decision | Input Voltage | Amplified Input (×8) | Counter **62** | Counter **61** |
|---|---|---|---|---|
| 512→256 | 7.500 mv. | 60 mv. | 0000001 | 0111111 |
| 256→128 | 17.500 mv. | 140 mv. | 0000011 | 0111111 |
| 128→64 | 37.500 mv. | 300 mv. | 0000111 | 0111111 |
| 64→32 | 77.500 mv. | 620 mv. | 0001111 | 0111111 |
| 32→8 | 157.500 mv. | 1260 mv. | 0011111 | 0111111 |
| 8→1 | 637.500 mv. | 5100 mv. | 1111111 | 0111111 |

The ADC is assumed to have 14 bit resolution in which case counters 61 and 62 each contain 7 bits, the full scale input to the ADC is assumed as 5.12 volts DC, and the "known" gain used for the first of two ADC conversion cycles in auto-gain mode is eight. The possible gains and their gain bit decode are shown in Table 2.

TABLE 2

Assumed Gain Bit Decode

| Gain | Gain Bits |
|---|---|
| 512 | 001 |
| 256 | 010 |
| 128 | 011 |
| 64 | 100 |
| 32 | 101 |
| 8 | 110 |
| 1 | 111 |

With the assumptions of Tables 1 and 2 in mind, the following is a description of the operation of the gain decode circuitry. At the end of integration of VX, the three binary bits of gain counter 60 are set to 001 which corresponds to a gain of 512, the highest assumed gain. During integration of V2, logic signal 35 is present to partly condition gate 53 to increment counter 60 over line 44 when:

1. Detector 82 detects one of the bit combinations shown in Table 1 for counter 62 and indicates its presence on line 42,
2. Bit 7 turns on line 46, and
3. The next clock pulse occurs on line 34.

Then during integration of V1, logic signal 37 is present to allow gate 54 to increment counter 60 via line 45 when:

1. Detectors 82 (line 42) and 81 (line 43) detect one of the bit combinations shown in Table 1 (counters 61 and 62 combined), and
2. The next clock 21 pulse occurs on 34.

Each increment of counter 60 in response to 44 and 45 input causes counter 60 to indicate the next lower gain as shown in Table 2 so that at the end of the ADC conversion cycle, counter 60 contains the gain bit decode of the optimum gain. Incrementing of counter 60 is inhibited when the gain of one is reached (bit decode of 111) by logic signal 47 degating detector 82. In a typical operating configuration, the three bits in gain counter 60 at the end of the first ADC cycle would be transferred to a register associated with the variable gain amplifier 12 in FIG. 1. This register would close appropriate switch points in an impedance ladder network which controls the amplifier feedback.

The particular circuitry that can be used for detecting the presence of specific bit configurations in counters 61 and 62 will be readily understood by those having normal skill in the art. For instance, a simple logical AND network can be used for this purpose. Further, a logical decoder network could be used to convert the counters 61 and 62 content into the three bit gain decision but the disadvantage of that approach is that the circuitry must be permitted to settle before a decoding cycle can be taken. The FIG. 3 configuration permits availability of the decision result as soon as the first conversion cycle is completed.

The circuitry thus described for this invention makes it possible to operate the system in an externally selectable mode. That is, data processing equipment such as a computer or other control system can be used to generate a command signal to the control logic to select the mode of operation. If the range of unknown analog input is known in advance, the control system can enable the control logic of FIGS. 1 or 2 so that a selected gain is set into the amplifier gain control register and only one ADC cycle is performed with its result being read out. The amplifier gain selected for this mode can be supplied from the control system to the control logic of FIGS. 1 or 2 for setting the gain control logic or the FIGS. 1 or 2 control logic can be preset to respond to selection of the one cycle mode by loading the gain control register directly. When the two cycle automatic gain decision mode is selected by the computer or control system, the FIGS. 1 or 2 control logic responds by performing the two cycle conversion as described before and thereafter transferring to the computer the composite content of counters 61 and 62 along with a representation of the three digits used from gain counter 60 for the second cycle amplifier gain setting. This permits the computer to determine the actual digital equivalent of the unknown analog input magnitude that was sampled. If desired, the least significant bits from the counter 61 and 62 result could be replaced with the counter 60 contents before transfer to the computer to avoid an extra cycle of data transfer to the computer.

The conversion speed of the present invention can be further improved by adding circuitry to detect that the optimum gain decision resulting from the first conversion cycle is identical to the preselected amplifier gain used for that first conversion cycle. The subsystem control logic can then respond to this identity signal by immediately gating the first ADC result to the computer and bypass the second conversion cycle. This improvement could be implemented by comparing the contents of gain counter 60 at the end of the first conversion cycle with the content of the gain selection register of amplifier 12 or with a prestored representation of the first cycle gain setting. In the event of such an identity, a logic signal would be sent to the subsystem control logic 14 or 26 at the end of the first ADC cycle. The subsystem control logic would respond by immediately gating the conversion result to the computer since the second ADC cycle would then be redundant and unnecessary.

While the invention has been particularly shown and described relative to the preferred embodiment and certain improvements or modifications thereof, various other changes, improvements or modifications will be understood by those having normal skill in the art without departing from the spirit of this invention.

What is claimed is:

1. Apparatus for converting an unknown analog input signal into an equivalent digital representation comprising a variable gain amplifier coupled for receiving said unknown analog signal and including means for digitally selecting one of a plurality of gain settings for said amplifier, converter means coupled to the output of said amplifier for responding to a control signal for cyclically converting said amplifier output to a digital representation thereof by incrementing at least one counter during each said conversion cycle, control means for setting said amplifier gain at a preselected value and for introducing a said control signal to said converter means for causing a first conversion cycle of said amplifier output, counting means having count positions each of which digitally correspond to one of the gain settings of said variable gain amplifier, detecting means responsive to preselected digital combinations in said converter counter for incrementing said counting means during said first conversion cycle, and said control means further including means for setting said gain selecting means of said amplifier in accordance with the count contained in said counting means at the end of said first conversion cycle and for introducing a control signal to said converter means for causing a second said conversion cycle of said amplifier output, whereby the combination of the result of said second conversion cycle and the count in said counting means at the end of said first conversion cycle represent the most accurate conversion of said unknown analog input within the operating capabilities of the combination of said amplifier and said converter means.

2. Apparatus in accordance with claim 1 which further includes means for comparing said preselected amplifier gain and the count in said counting means at the end of said first conversion cycle for providing an output signal indicative of identity therebetween, and means responsive to said comparing means output for preventing said second conversion cycle from being performed, whereby the result of said first conversion cycle can be immediately utilized upon detection of the presence of said comparing means output.

3. Apparatus in accordance with claim 1 wherein said counting means includes count positions constructed and arranged such that (a) a minimum count therein corresponds to the maximum gain setting for said amplifier, (b) a maximum count therein corresponds to the minimum gain setting for said amplifier, and (c) an intermediate count corresponds to a gain setting between the maximum and minimum gains of said amplifier.

means responsive to preselected digital combinations in said converter counter for incrementing said counting means so that the count in said counting means at the end of said first conversion cycle corresponds to said optimum gain setting.

4. Apparatus in accordance with claim 3 wherein said converter means is a multi-ramp integrating converter utilizing a plurality of counters each associated with integration of respective reference voltages, said detecting means further including a plurality of detector circuits each coupled for responding to preselected counts in respective ones of said converter counters, and logic means for enabling the said detector circuits in the same sequence said converter counters are activated by said converter, the enabled said detector circuits responding to composite digital count patterns in said converter counters for incrementing said counting means.

5. Apparatus in accordance with claim 4 which further includes a clock pulse source, and a plurality of gate circuits each associated with a respective said detector circuit for coupling clock pulses from said source into said counting means in response to enabling signals produced by the output of said associated detector circuit and a signal indicative that a said detector circuit associated with a higher ordered said converter counter has been enabled.

6. Apparatus in accordance with claim 5 which further includes means for comparing said preselected amplifier gain and the count contained in said counting means at the end of said first conversion cycle for producing a signal indicative of identity therebetween, and means responsive to said comparing means output for indicating that said first conversion result can be utilized directly without the need for said second conversion cycle.

* * * * *